United States Patent [19]

Myer

[11] Patent Number: 4,879,519

[45] Date of Patent: Nov. 7, 1989

[54] PREDISTORTION COMPENSATED LINEAR AMPLIFIER

[75] Inventor: Robert E. Myer, Denville, N.J.

[73] Assignee: American Telephone and Telegraph Company, AT&T Bell Labs, Murray Hill, N.J.

[21] Appl. No.: 265,187

[22] Filed: Oct. 31, 1988

[51] Int. Cl.[4] .............................................. H03F 1/32
[52] U.S. Cl. ..................................... 330/149; 330/151
[58] Field of Search ...................... 330/52, 124 R, 149, 330/151, 295; 328/163

[56] References Cited

U.S. PATENT DOCUMENTS

| | | | |
|---|---|---|---|
| 3,755,754 | 8/1973 | Putz | 330/149 |
| 3,922,617 | 11/1975 | Denniston et al. | 330/149 |
| 4,068,186 | 1/1978 | Sato et al. | 330/149 |
| 4,291,277 | 9/1981 | Davis et al. | 330/149 |
| 4,389,618 | 6/1983 | Bauman | 330/149 |
| 4,394,624 | 7/1983 | Bauman | 330/151 |
| 4,453,133 | 6/1984 | Travis | 330/149 |
| 4,465,980 | 8/1984 | Huang et al. | 330/149 |
| 4,554,514 | 11/1985 | Whartenby et al. | 330/149 |

FOREIGN PATENT DOCUMENTS

2107540  4/1983  United Kingdom ................ 330/149

*Primary Examiner*—James B. Mullins
*Attorney, Agent, or Firm*—Jack S. Cubert

[57] ABSTRACT

A distortion compensation circuit for power amplifier producing a prescribed distortion component receives an input signal having at least one carrier therein in a prescribed frequency range. The input signal is applied to a first circuit path having an amplifier that produces an amplified signal with the prescribed distortion component and to a second circuit path that delays the input signal without distortion. The output signals of the first and second circuit paths are combined in a first combiner to form a signal representative of the prescribed distortion component. A second combiner forms a signal having an amplified input signal component and inverted phase prescribed distortion component responsive to the output of the first combiner and the output the first circuit path. To eliminate signals other than the distortion component from the first combiner, the prescribed frequency range is scanned to detect a carrier signal and the amplitude and phase of the signal in the second circuit path is modified to remove the detected carrier from the output of the first combiner. Remaining distortion in the power amplifier output is removed by scanning the prescribed frequency range to detect an intermodulation product signal and modifying the amplitude and phase of the first combiner output to minimize the detected intermodulation product signal.

25 Claims, 8 Drawing Sheets

PREDISTORTION COMPENSATED LINEAR AMPLIFIER

FIELD OF THE INVENTION

This invention relates to high power RF amplifiers and more particularly to automatic control systems employing predistortion to improve the linearity of high power linear RF amplifiers.

BACKGROUND OF THE INVENTION

RF linear amplifiers utilize devices that exhibit non-linear characteristics at higher power levels whereby signal distortion is introduced. If more than one signal is applied to an RF amplifier, its non-linear characteristics cause an unwanted multiplicative interaction of the signals being amplified and the amplifier output contains intermodulation products. These intermodulation products cause interference and crosstalk over the amplifier frequency operating range which interference may exceed established transmission standards.

As is well known, intermodulation distortion can be reduced by predistorting the signal to be amplified to cancel the amplifier generated distortion. Some predistortion techniques such as described in U.S. Pat. No. 4,465,980 issued to H. Huang et al Aug. 14, 1984 use non-linear elements to compensate for the distortion generated in the amplifier. The characteristics of the non-linear elements, however, generally differ from those of the amplifier to be corrected so that compensation is only effective over a limited range. Other arrangements such as described in U.S. Pat. No. 4,291,277 issued to R. C. Davis, Sept. 22, 1981, or U.S. Pat. No. 4,554,514 issued to J. C. Whartenby, Nov. 19, 1985, utilizes the base band converted modulation component of one input signal to produce predistortion but is not effective for systems having a plurality of concurrent signals or over an extensive range of frequencies.

U.S. Pat. No. 3,755,754 issued to J. L. Putz, Aug. 28, 1973, describes a predistortion compensation arrangement for a microwave amplifier in which a multifrequency signal is applied to a power amplifier through a variable phase shifter and through a distortion producing amplifier having substantially similar distortion transfer characteristics. The output of the distortion producing amplifier is combined with the undistorted signal from the variable phase shifter to form a predistortion signal having distortion components opposite in phase to the distortion components of the power amplifier whereby compensation is obtained. In similar fashion, U.S. Pat. No. 4,068,186 issued to G. Sato et al, Jan. 10, 1978, discloses a circuit for compensating for non-linear characteristics in high frequency amplifiers in which an input signal is divided into two parts. One part is applied to a first transmission line having a delay line and the other part is applied to a second transmission line having a distortion producing high frequency amplifier. The vector sum of the transmission line outputs provides a non-linear characteristic that compensates for amplitude and phase non-linear characteristics of a high frequency amplifier connected in cascade with the compensating circuit. While the use of a distortion generating amplifier with similar distortion characteristics to the amplifier to be corrected provides a significant improvement, the control of the predistortion circuits is preset so that variations in circuit element characteristics due to changes in operating conditions may adversely affect distortion compensation.

U.S. Pat. No. 4,453,133 issued to G. W. Travis, June 5, 1984, and assigned to the same assignee discloses an active predistorter for linearity compensation which also utilizes distortion characteristics of an amplifier similar to the power amplifier to be corrected. An input signal is divided into a part that is applied to a signal path having a linear delay, a part that is applied to the distortion producing amplifier and a part that is combined with a portion of the output of the distortion producing amplifier to generate a phase inverted predistortion signal. The phase inverted predistortion signal is combined with the linear delay path signal and applied to the input of the amplifier to be corrected. Optionally, a portion of the power amplifier output signal is fedback to provide a closer match in the operating characteristics of the amplifier to be corrected and the distortion producing amplifier. This arrangement, however, results in attenuation of the input signal through the predistortion circuit and does not provide continuous control of the attenuation and phase characteristics needed for distortion compensation. It is an object of the invention to provide an improved predistortion circuit having automatic control of distortion compensation of a wide band linear power amplifier without loss.

SUMMARY OF THE INVENTION

The invention is directed to a distortion compensation arrangement for a power amplifier having prescribed distortion that receives one or more input signals including at least one carrier signal in a predetermined frequency range. The one or more input signals are applied to a first circuit path including a first amplifier having a predetermined gain which generates an output signal with the prescribed distortion responsive to the one or more input signals and to a second circuit path which transfers the one or more input signals without distortion. The first circuit path output signal is combined with the transferred one or more input signals from the output of the second circuit path to form a first signal having a component corresponding to the prescribed distortion. The first signal is combined with the output signal of the first circuit path to form a second signal having a component corresponding to the one or more input signals modified by the predetermined gain and a component corresponding to the prescribed distortion in inverted phase relationship thereto. Signals other than the prescribed distortion component are removed from the first signal by detecting a carrier signal in the prescribed frequency range, monitoring the detected carrier, and adjusting the magnitude and phase characteristics of one of the first and second circuit paths to minimize the detected carrier in the first signal.

According to one aspect of the invention, distortion is removed from the power amplifier output by detecting an intermodulation distortion signal thereat, monitoring the intermodulation distortion signal and adjusting the magnitude and phase of the first signal to minimize the monitored intermodulation distortion signal.

DETAILED DESCRIPTION

Figure 1:
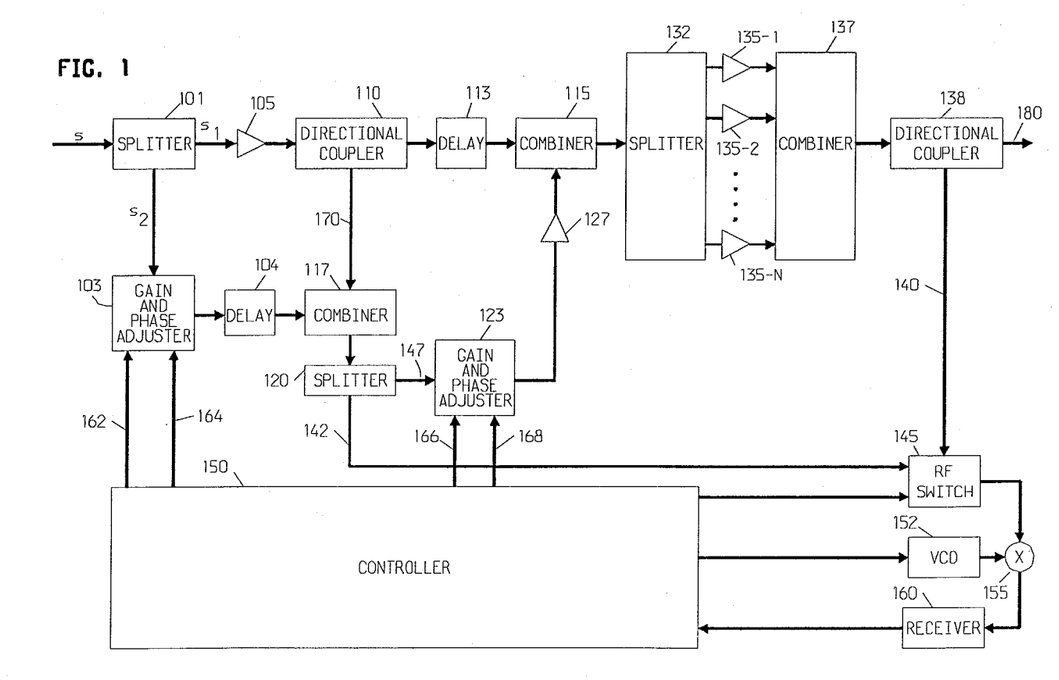
FIG. 1 depicts a block diagram of a distortion compensating circuit illustrative of the invention.

FIG. 1 depicts a distortion compensation arrangement for a power amplifier operative to amplify signals across a prescribed frequency band that is illustrative of the invention. In FIG. 1, the power amplifier comprises a plurality of substantially identical amplifiers 135-1 through 135-N connected in parallel. Each of these amplifiers receives its input from combiner 115 via multiple output splitter 132. The outputs of amplifiers 135-1 through 135-N are combined into a single high power signal in multiple input combiner 137. Since the amplifiers are substantially identical, each has the same prescribed distortion characteristic. The circuit of FIG. 1 includes a predistortion amplifier 105 which is substantially identical to amplifiers 135-1 through 135-N and therefore has the same distortion characteristic. Compensation is obtained by isolating the distortion component of the output of amplifier 105 and applying a phase inverted version of the distortion to the inputs of amplifiers 135-1 through 135-N. In accordance with the invention, the distortion compensation arrangement provides amplification of the one or more input signals applied thereto while adjusting the parameters to optimize the distortion compensation.

Referring to FIG. 1, a composite input signal s is split into two portions $s_1$ and $s_2$ in signal splitter 101. Portion $s_1$ is applied a first circuit path including amplifier 105. This amplifier provides a preset gain while inserting the prescribed distortion and supplies its output to directional coupler 110. The main output of coupler 110 is delayed in fixed delay element 113 and coupled therefrom to one input of combiner 115. Portion $s_2$ is applied to a second circuit path including gain and phase adjuster 103. Signal $s_2$ is modified by gain and phase adjuster 103 and applied to combiner 117 wherein a portion of the output of directional coupler 110 is combined with the modified signal $s_2$ to minimize signals other than a component corresponding to the distortion output of amplifier 105. If the amplitude and the phase of the signal from gain and phase adjuster 103 are properly adjusted, the amplified signal from directional coupler 110 is cancelled by the clean signal from delay 104 so that only the prescribed distortion appears at the output of combiner 117. Splitter 120 supplies a portion of the output of combiner 117 on lead 142 to a control arrangement including controller 150 to control the parameters of gain and phase adjuster 103 as will be described.

The output of splitter 120 is applied to gain and phase adjuster 123 via lead 147. The modified distortion signal from adjuster 123 is inverted and amplified in voltage amplifier 127 by a preset amount and applied to an input of combiner 115. Adjuster 123 is adapted to modify the magnitude and the phase of the distortion signal from combiner 117 so that the distortion component of the signal from combiner 115 is equal to the prescribed distortion of amplifiers 135-1 through 135-N but inverted in phase. As a result of the operation of the distortion compensation arrangement, the distortion produced by amplifiers 135-1 through 135-N is cancelled by the oppositely phased distortion signal applied to the inputs of these amplifiers from combiner 115. The time delay of fixed delay element 113 is set to compensate for differences in the delays between the alternative paths for the input signal and the parameters of adjuster 123 are controlled by monitoring the distortion output of the amplifiers at directional coupler 138 and modifying the adjuster parameters to minimize the distortion output of the paralleled amplifiers.

In order to assure that the output of combiner 117 is representative of the prescribed distortion, the signal from splitter 138 on lead 140 is sent through RF switch 145 to mixer 155. Controller 150 supplies a scan signal to the other input of mixer 155 so that the prescribed frequency range of the amplifier is scanned from its low end to its high end. When a carrier signal is detected, the scan is interrupted and the carrier frequency is held. RF switch 145 then connects the output of splitter 120 to mixer 155 via lead 142 so that the output of combiner 117 is monitored by narrow band receiver 160. Controller 150 is then operative to modify the parameters of gain and phase adjuster 103 to reduce the magnitude of the detected carrier in the signal appearing at the output of combiner 117. The parameter modification operations are repeated until either the magnitude of the monitored carrier signal is minimized or a preset number of modifications have been completed.

Figure 8:
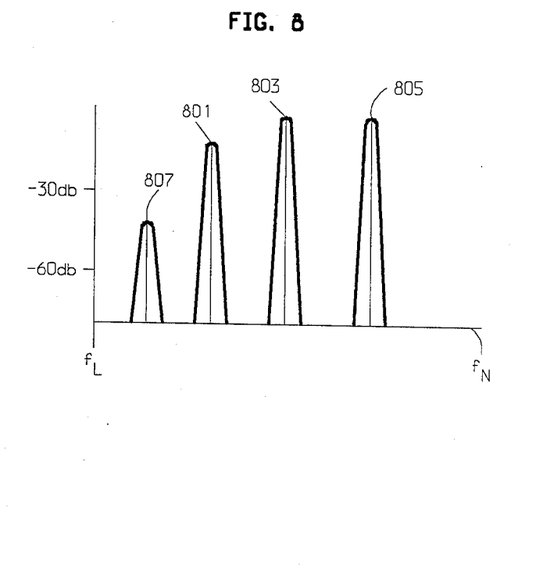
FIG. 8 shows waveforms illustrating the operations of FIGS. 1 and 6.

FIG. 8 illustrates the frequency band of the circuit of FIG. 1. Both carrier and intermodulation distortion signals occur within the band. Carrier signals shown in waveforms 801, 803 and 805 have amplitudes greater than −30 db and an intermodulation distortion product signal 807 has an amplitude between −30 and −60 db. In accordance with the invention, controller 150 is operative to scan output 180 from one end, e.g., $f_L$, of the prescribed frequency band of the circuit of FIG. 1 to locate carrier signal $S_c$ (waveform 801). Once the carrier signal is located, the magnitude of the carrier signal from combiner circuit 117 is monitored by the controller via RF switch 145, mixer 155 and narrow band receiver 160 and the amplitude and phase parameters of amplitude and phase adjuster 103 are iteratively modified to drive the carrier signal component of the output of the combiner 117 to a minimum. This amplitude and phase adjustment assures that the output of combiner 117 has the maximum carrier signal reduction.

It is also necessary to minimize the intermodulation product component of the power amplifier output. In accordance with the invention, the prescribed frequency band is again scanned from end $f_L$ in FIG. 8 by connecting the output of splitter 138 to mixer 155 via lead 140 and RF switch 145 to detect the intermodulation product signal of waveform 807. Once the intermodulation product signal is found, the parameters of amplitude and phase adjuster 123 are iteratively modified to minimize the intermodulation product signal appearing on lead 140 from directional coupler 138. Advantageously, it is not necessary to remove a portion of the prescribed frequency band from service in order to insert a pilot signal for distortion reduction.

Figure 2:
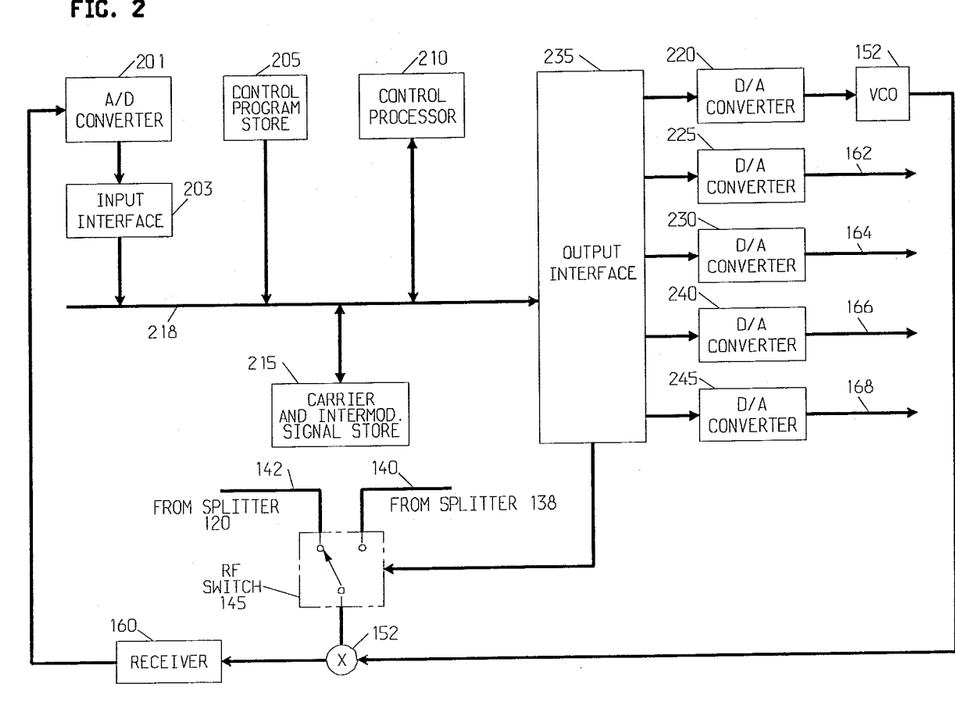
FIG. 2 shows a more detailed block diagram of the controller of FIG. 1.

Controller 150 is shown in greater detail in FIG. 2. The circuit of FIG. 2 comprises a signal processor arrangement such as the Intel type D87C51 microprocessor and includes control program store 205 and control processor 210, carrier and intermodulation signal store 215, input interface 203, output interface 235 and bus 218. Analog to digital converter 201 receives signals representative of the magnitude of signals from receiver 160 and converts the analog signal into a series of digital values. Control processor 210 operating in accordance with instructions stored in control program store 205 causes these digital values to be sent to store 215 via input interface 203 and bus 218. The processor also provides digital signals to digital to analog converters 220, 225, 230, 240 and 245 via bus 218 and output interface 235. The analog output of converter 220 is supplied to voltage controlled oscillator (VCO) 152 to direct scanning operations. The output of converters 225 and 230 are sent to amplitude adjustment control and the phase adjustment control of amplitude and phase adjuster 103 via leads 162 and 164 to modify its amplitude and phase characteristics, respectively. The outputs of converters 240 and 245 are sent to amplitude and phase adjuster 123 via leads 166 and 168 to modify its amplitude and phase parameters. Interface 235 is also connected to the control lead of RF switch 145 to determine its position during the control operations.

Prior to the start of operation of the circuit of FIG. 1, amplitude and phase adjusters 103 and 123 are manually trimmed to optimum settings. Controller 150 is adapted to maintain optimum operation over time under varying conditions. Amplitude and phase adjuster 103 modifies the amplitude and phase characteristics of signal $s_2$ so that the amplified signal component of amplifier 105 is cancelled by the undistorted output signal from gain and phase adjuster 103. The controller is first connected to directional coupler 138 by RF switch 145 and directs the scanning of the frequency spectrum of the signal therefrom through VCO 152, mixer 155 and narrow band receiver 160 to detect a carrier. It is then connected to splitter 120 at the output of combiner 117 and the amplitude and phase parameters of adjuster 103 are adjusted to minimize the magnitude of the carrier appearing on lead 142. After the carrier component is minimized or a preset number of adjustments are made, the controller operates to scan the prescribed frequency band from end $f_L$ to detect an intermodulation signal and makes a sequence of adjustments of the amplitude and phase parameters of adjuster 123 to reduce the intermodulation signal on lead 140 below a prescribed threshold. The controller continuously cycles through parameter adjustment of amplitude and phase adjusters 103 and 123.

Figure 3:
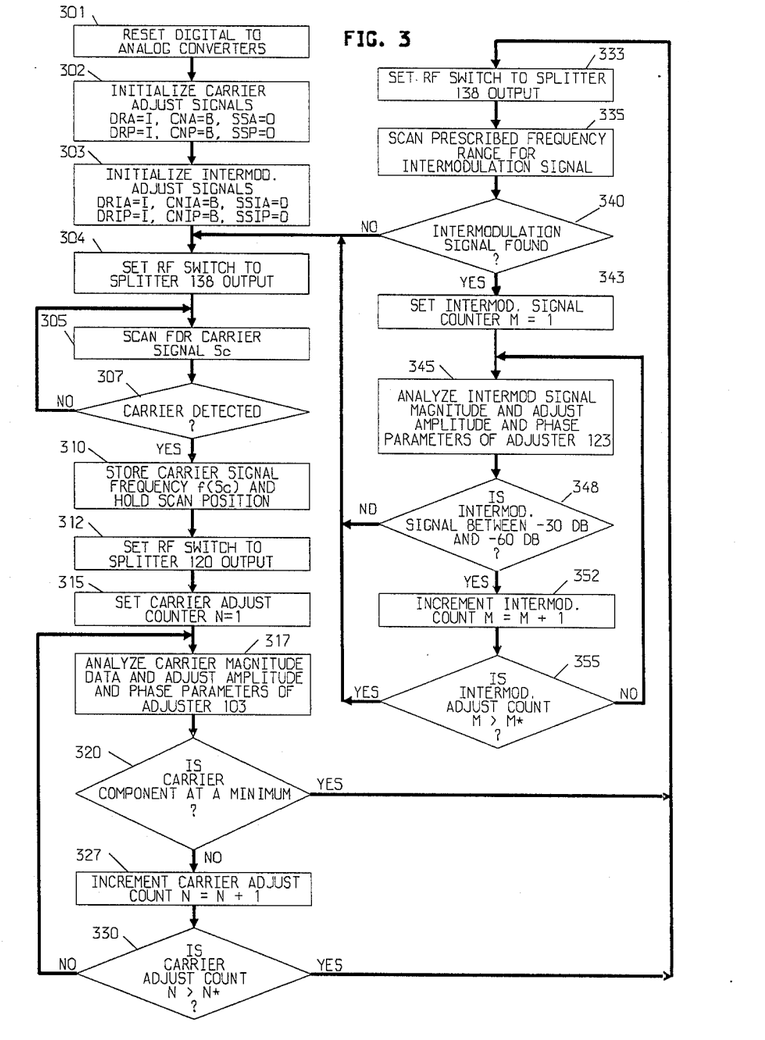
FIGS. 3, 4 and 5 are flow charts illustrating the operation of the controller of FIG. 2.

The operation of the controller of FIG. 2 is directed by instructions permanently stored in control program store 205. FIG. 3 is a flow chart illustrating the operation of the controller 150 in accordance with the instructions stored therein. With reference to FIGS. 2 and 3, control processor 210 initially resets digital to analog converters 220, 225, 230, 240 and 245 as per program step 301. Carrier adjustment control signals and the intermodulation adjustment control signals are then initialized in steps 302 and 303 and RF switch 145 is set to receive the signal on lead 140 (step 304). At this time, VCO circuit 152 is set by digital to analog converter 220 to be at the $f_L$ end of the prescribed frequency range of the amplifier. RF switch 145 is set to couple lead 140 to one input of mixer 145 and VCO 152 is connected to the other input of mixer 155. In the loop from step 305 to step 307, the prescribed frequency band is scanned (step 305) until a carrier signal is detected at lead 140 (step 307). Signals obtained at narrow band receiver 160 during the scan are applied to analog to digital converter 201 in FIG. 2 and stored by the control processor in data store 215. Upon detection of a carrier signal by the control processor, the carrier signal amplitude and frequency are stored and the scan frequency of VCO 152 is maintained (step 310).

Processor 210 then sends a signal to RF switch 145 to change its position to couple the distortion signal from splitter 120 to mixer 155 (step 312). At this time, the signal on lead 142 corresponding to the detected carrier is applied from receiver 160 to analog to digital converter 201. A signal N which counts the number of carrier signal adjustments is then set to one (step 315) and the carrier signal adjustment loop from step 317 to step 330 is entered. During the iterative detected carrier signal adjustments, the parameters of amplitude and phase adjuster 103 are modified to minimize the carrier signal observed by the control processor. The loop is iterated until the carrier signal falls below a predetermined threshold or until a preset number of adjustments have been made.

In the carrier adjustment loop, the carrier signal at splitter 120 is applied to analog to digital converter 201 via RF switch 145, mixer 155 and receiver 160. The carrier magnitude data is analyzed and adjustments are made to the amplitude and phase parameters of adjuster 103 (step 317). The magnitude of the carrier signal $M(S_c)$ is compared to the predetermined threshold in decision step 320 by processor 210. Until the carrier magnitude is less than the threshold TO, the loop is iterated. If the magnitude of the carrier signal at splitter 120 is less than the threshold value, the carrier component in the output of combiner 117 in FIG. 1 is determined to be acceptable, control is passed to step 333 and the intermodulation signal reduction is started. Where the magnitude is equal to or greater than the threshold value TH, the carrier adjustment count is incremented (step 327) and compared to a predetermined number N* (step 330). If N* is exceeded, the iterations are terminated and the intermodulation product signal reduction is begun in step 333. The operations of detected carrier signal data analysis step 317 are shown in greater detail in the flow chart of FIG. 4.

Figure 4:
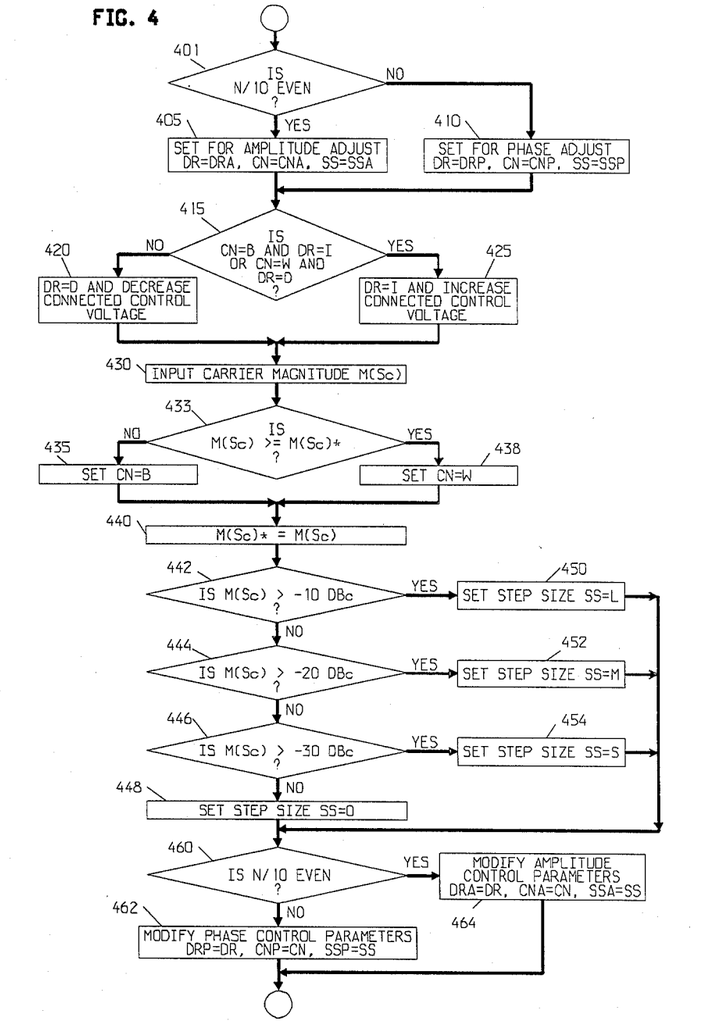

With reference to FIG. 4, the analysis involves separate adjustments of the amplitude and phase parameters of adjuster 103. Decision step 401 is entered from step 315 or step 330 to determine whether the amplitude or the phase parameter is to be adjusted in the current iteration. This is done by dividing the adjustment count signal N by 10. If the result is even, the control signals DR, CN and SS are set to the amplitude adjustment values DRA, CNA and SSA in step 405. Otherwise the adjustment control signals DR, CN and SS are set to DRP, CNP and SSP for phase adjustment in step 410. Assume for purposes of illustration that amplitude adjustment is selected. The direction of change control signal DR is initially set to the value, i.e., I (increase) or D (decrease), obtained in the last iteration. The condition control signal is set to either B (better) or W (worse) corresponding to the corrective value of the last iteration and the correction step size SS is set to a large value, medium value or small value corresponding to the last iteration.

Decision step 415 is then entered in which the control parameters are evaluated. If CN=B and DR=I or CN=W and DR=D indicating an improvement on increase or a worsening on decrease during the last iteration, control signal DR is set to I and the control voltage on amplitude adjustment digital to analog converter 225 is increased by an amount corresponding to the setting of step size signal SS (step 425). In the event that the condition CN=B and DR=I or CN=W and DR=D is not satisfied, direction control DR is set to D and the control voltage on the amplitude adjustment converter is decreased by the amount corresponding to the last iteration step size SS (step 420). In the initial iteration, the step size is preset to zero.

After the adjustment of step 420 or step 425, the carrier detected signal amplitude M(Sc) is input from receiver 160 of FIG. 1 (step 430) and compared to the amplitude of the preceding iteration M(Sc)* (step 433). If M(Sc) ≧M(Sc)*, the adjustment status is worse and condition signal CN is set to W (step 438). Where M(Sc) is smaller than M(Sc)*, the adjustment status is better and CN is set to B (step 435). M(Sc)* is then set to the current magnitude value M(Sc) in step 440 preparatory for the next iteration.

The range of the present magnitude signal M(Sc) is then determined in decision steps 442, 444 and 446 so that the step size of the next iteration can be adjusted. If the magnitude of M(Sc) is greater than −10 db relative to the peak of the detected carrier, the step size is set to a large value in step 450 so that the next adjustment provides a large correction. A magnitude of M(Sc) between −10 and −20 db causes the step size to be set to a medium value in step 452 and a step size between −20 and −30 db generates a small step size in step 454. If the magnitude of M(Sc) is less than −30 db, the step size is set to zero in step 448. Since N/10 is even for amplitude adjustment, step 464 is entered via decision step 460 and the updated parameters DR, CN and SS are stored as signals DRA, CNA and SSA. If N/10 is odd, control parameters DR, CN and SS are stored as signals DRP, CNP and SSP in step 462. Processor control is then passed to step 320 in FIG. 3.

Where the signal N/10 is odd, the operation of the control processor is the same as previously described with respect to FIG. 4 except that condition control signal CNP, direction control signal DRP and step size signal SSP are obtained as indicated in step 410 and used as control signals CN, DR and SS. Maximum adjustment count signal N* may be set to a high value so that the control processor adjusts one of the amplitude and phase parameters of adjuster 103 several times and then adjusts the other of the amplitude and phase parameters several times or until the magnitude of the carrier signal M(Sc) falls below threshold TH.

When the carrier processing loop of FIG. 3 is exited via decision step 320 or 330, processor 210 causes RF switch 145 to be repositioned so that lead 140 from directional coupler 138 is connected to one input of mixer 155 and the output of receiver 160 corresponds to the output signal at lead 140 (step 333). The controller is then conditioned to scan the frequency range of the amplifier from the same end used as the starting frequency of the carrier signal to search for an intermodulation product signal (step 335). If such an intermodulation product signal is detected in step 340 prior to the carrier frequency f(Sc), the intermodulation count signal M is set to one (step 343) and intermodulation adjustment loop from step 345 to step 355 is entered. Otherwise, the processor returns to step 304 so that the carrier scan process of steps 305 and 307 is restarted.

In the intermodulation reduction loop, processor 210 analyses the intermodulation signal magnitude IM and adjusts the amplitude and phase of adjuster 123 responsive thereto (step 345). After an adjustment is made to adjuster 123, the intermodulation signal IM is tested in decision step 348. If the magnitude IM is not between −30 and −60 db, processor control is passed to step 304 and the carrier signal search loop is reentered. When the IM signal is between −30 and −60 db, another iteration of the intermodulation reduction loop is needed and intermodulation count signal M is incremented (step 352). The incremented value is compared to a maximum count signal M* (step 355) and the loop is reentered in step 345. If the magnitude IM is greater than −30 db, the detected signal may not be an intermodulation signal and control is returned to step 304. Where magnitude IM is below −60 db, the value is acceptable and step 304 is reentered. The intermodulation reduction loop may be exited from either decision steps 348 or 355.

Figure 5:
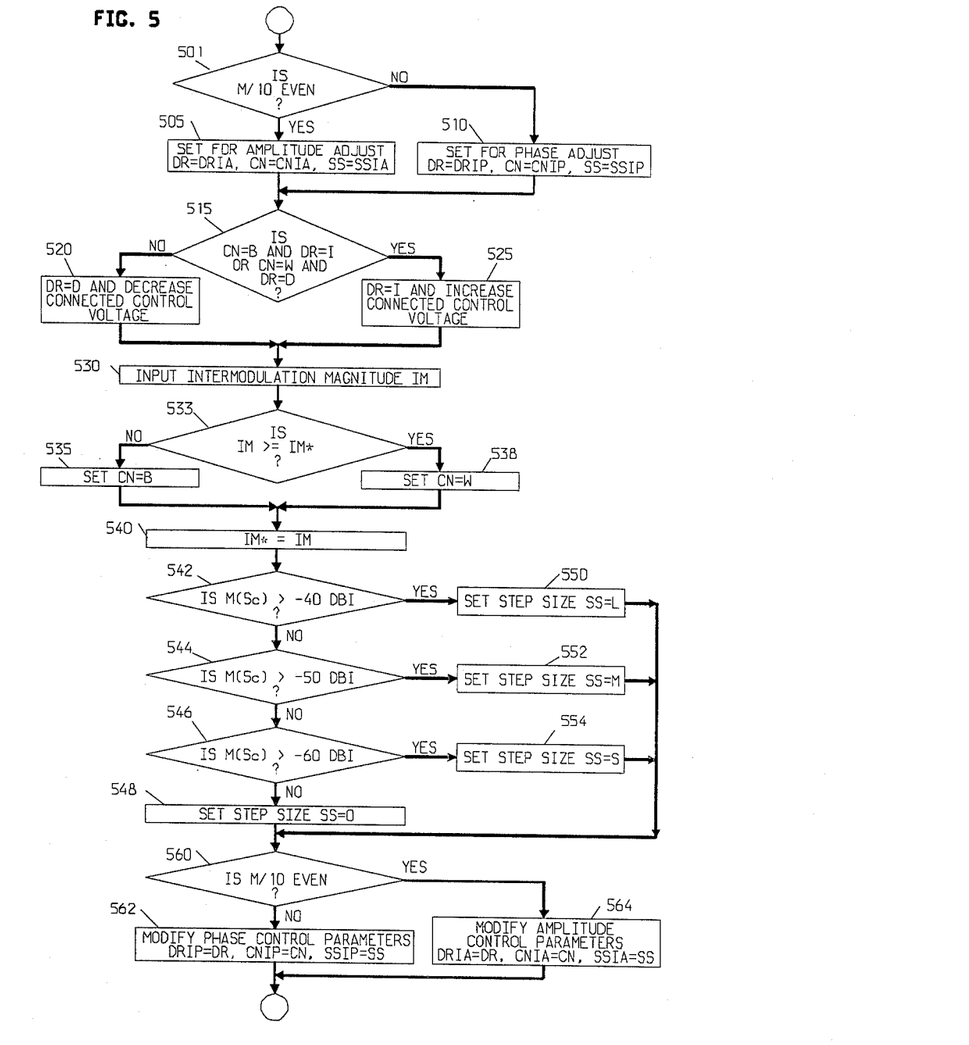

The intermodulation signal analysis and adjustment step 345 is shown in greater detail in FIG. 5. Referring to FIG. 5, the analysis involves separate adjustment of the amplitude and phase parameters of adjuster 123. Decision step 501 is entered from step 343 or 355 in FIG. 3 to determine whether the amplitude or the phase parameter is to be adjusted in the current iteration. This is done by dividing the adjustment count signal M by 10. If the result is even, the control signals for adjustments DR, CN, and SS are set to previous amplitude intermodulation adjustment values DRIA, CNIA and SSIA in step 505. Otherwise, the adjustment control signals DR, CN, and SS are set to previous phase intermodulation adjustment values DRIP, CNIP and SSIP in step 510. Assume for purposes of illustration that amplitude adjustment is selected. The direction of change control signal DR is initially set to the value, i.e., I (increase) or D (decrease), obtained in the last iteration. The condition control signal is set to either B (better) or W (worse) corresponding the corrective value of the last iteration and the correction step size SS is set to a large value, medium value or small value corresponding to the last iteration.

Decision step 515 is then entered wherein the control parameters are evaluated. If CN=B and DR=I or CN=W and DR=D indicating an improvement on increase or a worsening on decrease during the last iteration, control signal DR is set to I and the control voltage on amplitude adjustment digital to analog converter 240 is increased by an amount corresponding to the setting of step size signal SS (step 525). In the event that the condition CN=B and DR=I or CN=W and DR=D is not satisfied, direction control DR is set to D and the control voltage on the amplitude adjustment converter is decreased by the amount corresponding to the last iteration step size SS (step 520). In the initial iteration, the step size is preset to zero.

After the adjustment of step 520 or step 525, the intermodulation signal amplitude IM is input from receiver 160 of FIG. 1 (step 530) and compared to the amplitude of the preceding iteration IM* (step 533). If IM≧IM*, the adjustment status is worse and condition signal CN is set to W (step 538). Where IM is smaller than IM*, the adjustment status is better and CN is set to B (step 535). IM* is then set to the current magnitude value IM in step 540 preparatory for the next iteration.

The range of the present magnitude signal IM is then determined in decision steps 542, 544 and 546 so that the step size of the next iteration can be is adjusted. If the magnitude of IM is greater than −40 db relative to the peak of the detected carrier the step is set to a large value in step 550 and the next adjustment provides a large correction. A magnitude of IM between −40 and −50 db causes the step size to be set to a medium value in step 552 and a step size between −50 and −60 db generates a small step size in step 554. If the magnitude of IM is less than −60 db, the step size is set to zero in step 548. Since M/10 is even for amplitude adjustment, step 564 is entered via decision step 560 and the updated parameters DR, CN and SS stored as signals DRIA, CNIA and SSIA. If M/10 is odd, control parameters DR, CN and SS are stored as signals DRIP, CNIP and SSIP in step 562. Processor control is then passed to step 348 in FIG. 3.

Where the signal M/10 is odd (phase adjustment), the operation of the control processor is the same as previously described with respect to FIG. 5 except that condition control signal CNIP, direction control signal DRIP and step size signal SSIP are obtained as indicated in step 510 and used as control signals CN, DR and SS. Maximum adjustment count signal M* may be set to a high value so that the control processor adjusts one of the amplitude and phase parameters of adjuster 103 several times and then adjusts the other of the amplitude and phase parameters several times or until the condition of step 448 is met.

When the data analysis and comparison of steps 345 and 348 are completed, intermodulation count M is incremented (step 352) and the count is compared to the maximum allowable count M(Sc)* in decision step 355. If M>M*, step 304 is reentered to begin the carrier signal search operations. Where M≦M* in step 355, the next iteration is then started in step 345. The iterations are ended when the intermodulation product signal is outside the −30 to −60 db range set in decision step 348 or the iterations time out in step 355 because count signal M>M*. As a result of the intermodulation reduction loop operation, the intermodulation distortion is reduced by readjusting the parameters of amplitude and phase adjuster 123 until an acceptable level of intermodulation distortion is obtained.

Figure 6:
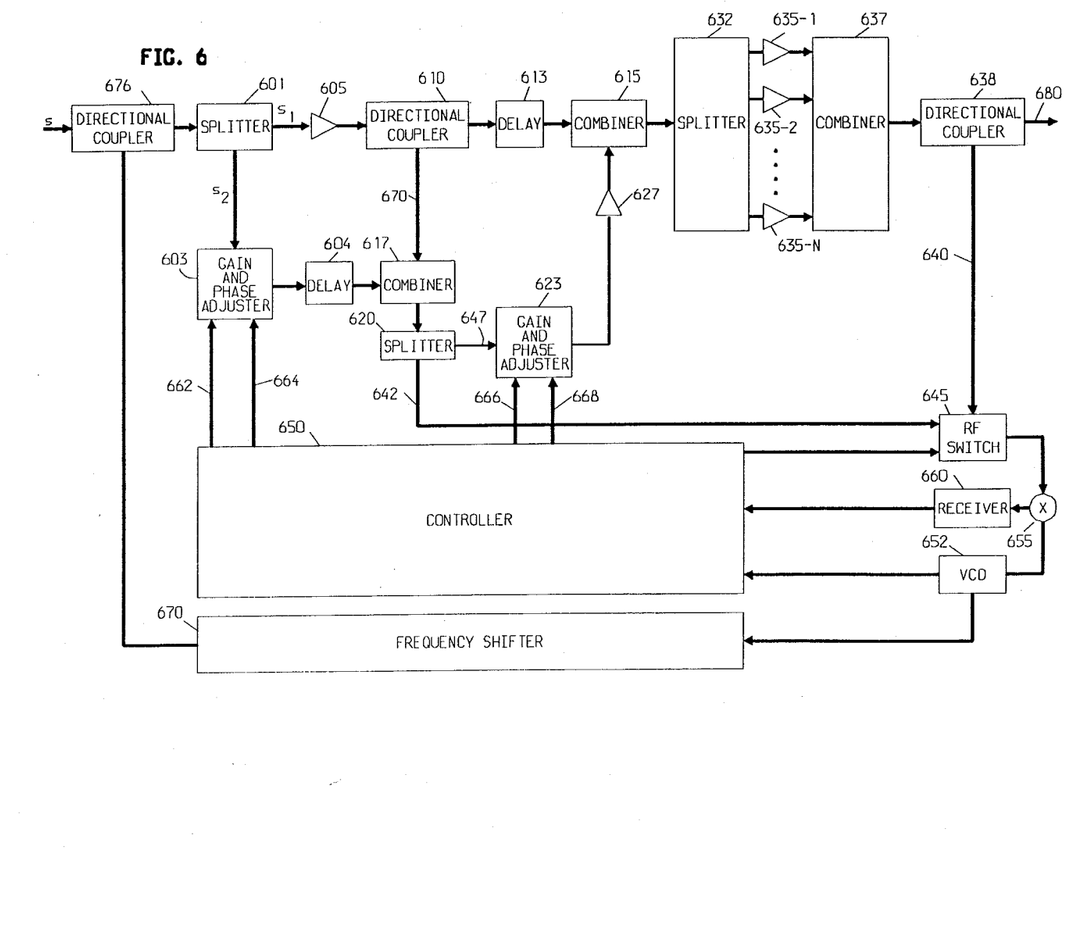
FIG. 6 depicts a block diagram of another distortion compensating circuit illustrative of the invention.

FIG. 6 depicts a block diagram of another embodiment illustrative of the invention in which the prescribed frequency range of the amplifier circuit is scanned preferably from the center of the band $f_c$ to the high end to locate a frequency at which there is no carrier or other signal except noise. Upon detection of a location in the frequency range where only noise is detected, a pilot signal having the detected frequency is introduced into the input of the power amplifier. The pilot operates in the same manner as the detected carrier signal described with respect to FIG. 1 so that the parameters of the amplitude and phase adjuster for the elimination of the carrier signal may be modified to minimize the pilot signal and the parameters of the gain and phase adjuster to modify the distortion signal may be changed to minimize the intermodulation products signal.

Referring to FIG. 6, the first circuit path includes splitter 601, predistortion amplifier 605 and directional coupler 610 which operate as described with respect to FIG. 1. In addition, directional coupler 676 is inserted before splitter 601 so that a pilot signal may be introduced. The second circuit path comprises gain and phase adjuster 603, delay 604 and combiner 617. Combiner 617 cancels the amplified signal component from predistortion amplifier 605 with the input signal from the gain and phase adjustment circuit path so that the distortion component appears at the input of splitter 620. Amplitude and phase adjuster 623 modifies the distortion component from combiner 617 and applies the modified distortion component to combiner 615 via voltage amplifier 627 so that the phase inverted prescribed distortion is applied to the inputs of paralleled amplifiers 635-1 through 635-N. The amplifier output is obtained at lead 680 via directional coupler 638. In FIG. 6, the pilot signal is introduced into both the predistortion amplifier path and the gain and phase adjustment path and the magnitude of the pilot signal at the output of combiner 617 is used to adjust the amplitude and phase parameters of adjuster 603 to keep the pilot signal magnitude at the combiner output at its minimum value.

Controller 650 is substantially the same as controller 150 of FIG. 1 except that the instructions in control program store 205 are modified to scan the prescribed frequency band from $f_c$ to locate a frequency at which there is no signal and to insert a pilot signal at that frequency into directional coupler 676. In order to generate a pilot signal, VCO 652 drives frequency shifter 670 so that it produces a signal at the detected frequency. The inserted pilot then operates as a carrier as described with respect to the flow charts of FIGS. 3 and 4. The operations of FIG. 3 and FIG. 5 with respect to intermodulation product signal reduction are unchanged. Thus rather than scanning for a carrier signal as in steps 305 and 307, the scan steps illustrated in FIG. 7 are performed.

Figure 7:
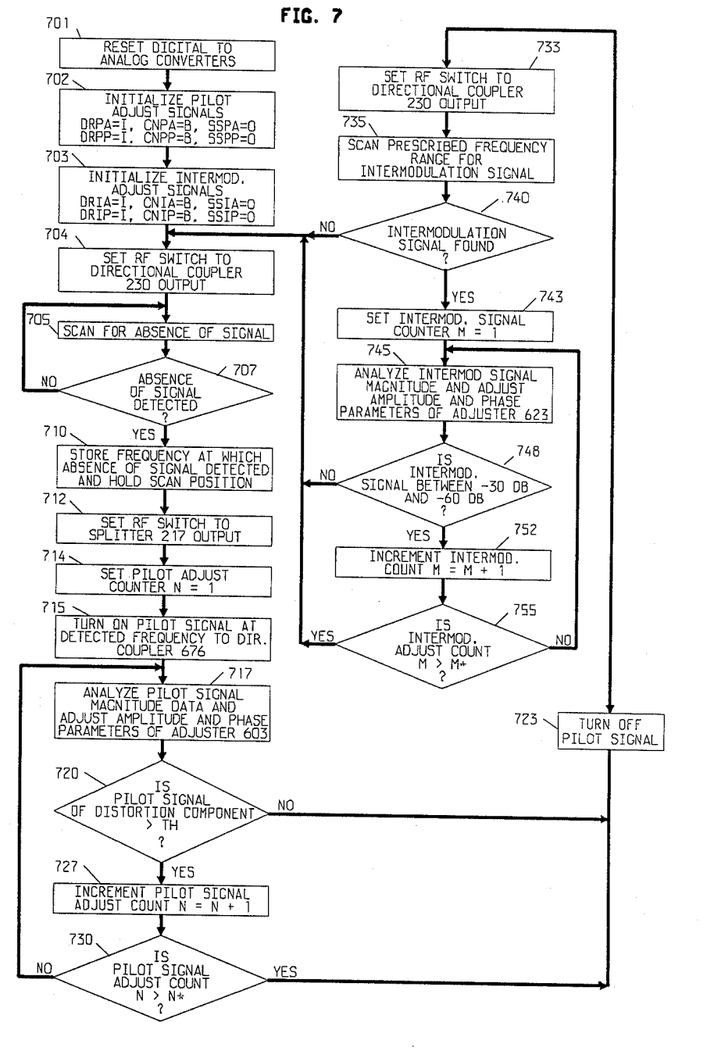
FIG. 7 is a flow chart illustrating the operation of the controller of FIG. 6.

With reference to FIG. 7, digital to analog converters 225, 230, 240 and 245 are initially reset in step 701 and the pilot adjust and intermodulation adjust control signals are initialized in steps 702 and 703. RF switch 645 is then set to couple the signal on lead 640 to mixer 655 (step 704) and controller 650 is directed to scan from one end of the prescribed frequency band for a frequency at which there is no signal (step 705). When the absence of a signal is detected in step 707, the detected frequency is stored (step 710) in data store 215 of FIG. 2. RF switch 645 is then set to connect splitter 620 to mixer 655 (step 712) and the pilot adjust count signal in the controller processor is reset to one (step 714). A pilot signal is then turned on in VCO 652 and converted to the detected frequency in frequency shifter 670. The detected frequency pilot signal is then applied to directional coupler 676 (step 715). The remaining operations of FIG. 7 correspond to the operations with respect to FIG. 1 shown in FIG. 3 except that the magnitude of the pilot signal is analyzed in step 717 of FIG. 7 and FIG. 4 and the pilot signal is turned off after the pilot minimizing operations are completed (step 723 of FIG. 7). The intermodulation signal reduction in steps 733 through 755 are the same as the corresponding steps in FIG. 3 and FIG. 5 and the intermodulation signal is the first such signal detected in the scan operations of steps 735 and 740. Advantageously, the pilot is inserted at any unused part of the amplifier frequency band and the full frequency band except for the unused pilot frequency may be used for transmission.

The invention has been described with reference to illustrative embodiments thereof. It is apparent, however, to one skilled in the art that various modifications and changes may be made without departing from the spirit and scope of the invention.

I claim:
1. A distortion compensation circuit for a power amplifier having a prescribed distortion characteristic comprising;
   means for receiving one or more input signals including at least one carrier signal in a predetermined frequency range;
   a first circuit path having an input connected to the receiving means and an output including a first amplifier with a predetermined gain and substantially the same prescribed distortion characteristic as the power amplifier responsive to the one or more input signals for generating an output signal including a component corresponding to the one or more input signals modified by said predetermined gain and a distortion component corresponding to the prescribed distortion characteristic;

a second circuit path having an input connected to the receiving means and an output for transferring the one or more input signals without distortion;

first means for combining the output of the first circuit path with the transferred one or more input signals from the output of the second circuit path to form a signal corresponding to the distortion component of the first circuit path output signal;

second means for combining the distortion component signal from the first combining means with the output signal of the first circuit path to form a signal having a component corresponding to the one or more input signals modified by the predetermined gain and a component corresponding to the distortion characteristic of the first amplifier in inverted phase relationship thereto; and means for controlling the signal formed in the first combining means including
means for detecting a carrier signal in the prescribed frequency range;
means connected to the output of the first combining means for monitoring the detected carrier signal at the output of the first combining means; and
means in the second circuit path responsive to the output of said monitoring means for adjusting the magnitude and phase of the signal applied to the second circuit path to minimize the monitored carrier signal.

2. A distortion compensation circuit for a power amplifier having a prescribed distortion characteristic according to claim 1 wherein said means for detecting a carrier signal in the prescribed frequency range comprises means connected to the output of said power amplifier for scanning the prescribed frequency range for a signal at said power amplifier output having a magnitude above a first predetermined threshold.

3. A distortion compensation circuit for a power amplifier having a prescribed distortion characteristic according to claim 2 wherein said means for monitoring said detected carrier signal comprises
means for generating a signal representative of the magnitude of the detected carrier signal;
means connected between the means for generating a signal representative of the magnitude of the detected carrier signal and means for adjusting the magnitude and the phase of the signal applied to the second circuit path responsive to the signal representative of the magnitude of the detected carrier signal for producing first and second adjusting signals;
means for applying the first adjusting signal to modify the magnitude of the signal applied to the second circuit path, and
means for applying the second adjusting signal to modify the phase of the signal applied to the second circuit path.

4. A distortion compensation circuit for a power amplifier having a prescribed distortion characteristic according to claim 3 wherein the means for producing said first and second adjusting means comprises means responsive to the magnitude of the detected carrier signal for sequentially producing one or more first adjusting signals until a fixed number of first adjusting signals is reached or the magnitude of the monitored detected carrier signal falls below the first threshold; and
means responsive to the magnitude of the detected carrier signal for sequentially producing one or more second adjusting signals until a fixed number of second adjusting signals is reached or the magnitude of the monitored detected carrier signal falls below the first threshold.

5. A distortion compensation circuit for a power amplifier having a prescribed distortion characteristic according to claim 4 wherein the means for scanning the prescribed frequency range further comprises means responsive to the output of the power amplifier for changing the frequency of the signals from the output of the power amplifier to a predetermined frequency; and
a narrow band receiver for receiving the scanned signals at the predetermined frequency.

6. A distortion compensation circuit for a power amplifier having a prescribed distortion characteristic according to claim 1 wherein the power amplifier comprises a plurality of amplifiers connected in parallel each having the prescribed distortion characteristic and the first amplifier has substantially the same distortion characteristic as each of the plurality of amplifiers connected in parallel.

7. A distortion compensation circuit for a power amplifier having a prescribed distortion characteristic according to claim 1 further comprising means for controlling the signal formed in said second combining means including:
means for detecting an intermodulation product signal in the prescribed frequency range;
means connected to the output of the power amplifier for monitoring the detected intermodulation product signal at the output of the power amplifier: and
means connected between the first and second combining means for adjusting the magnitude and phase of the first combining means output signal to minimize the monitored intermodulation product signal.

8. A distortion compensation circuit for a power amplifier having a prescribed distortion characteristic according to claim 7 wherein said means connected between the first and second combining means adjusting the magnitude and phase of the first combining means output signal to minimize the monitored intermodulation product signal further comprises means for inverting the phase of the first combining means output signal.

9. A distortion compensation circuit for a power amplifier having a prescribed distortion characteristic according to claim 8 wherein such means for detecting an intermodulation product signal in the prescribed frequency range comprises means connected to the output of said power amplifier for scanning the prescribed frequency range for a signal at said power amplifier output having a magnitude between the first predetermined threshold and a second predetermined threshold below the first threshold.

10. A distortion compensation circuit for a power amplifier having a prescribed distortion characteristic according to claim 9 wherein said means for monitoring said detected intermodulation product signal comprises means for generating a signal representative of the magnitude of the detected intermodulation product signal;

means connected to the means for generating a signal representative of the magnitude of the intermodulation product signal for producing first and second adjusting signals;

means for applying the first adjusting signal to the means for adjusting the magnitude and phase of the first combining means output signal to modify the magnitude of the first combining means output signal; and means for applying the second adjusting signal to the means for adjusting the magnitude and phase of the first combining means output signal to modify the phase of the first combining means output signal.

11. A distortion compensation circuit for a power amplifier having a prescribed distortion characteristic according to claim 10 wherein the means for producing said first and second adjusting signals comprises means responsive to the magnitude of the monitored intermodulation product signal for sequentially producing one or more first adjusting signals until a fixed number of first adjusting signals is reached or the magnitude of the monitored intermodulation product signal falls below the second threshold;

means responsive to the magnitude of the monitored intermodulation product signal for sequentially producing one or more second adjusting signals until a fixed number of second adjusting signals is reached or the magnitude of the monitored intermodulation product signal falls below the second threshold.

12. A distortion compensation circuit for a power amplifier having a prescribed distortion characteristic according to claim 11 wherein the means for scanning the prescribed frequency range further comprises means responsive to the output of the power amplifier for changing the frequency of the signals from the output of the power amplifier to a predetermined frequency; and a narrow band receiver for receiving the predetermined frequency.

13. A distortion compensation circuit for a power amplifier having a prescribed distortion characteristic according to claim 7 wherein the power amplifier comprises a plurality of amplifiers connected in parallel each having the prescribed distortion characteristic and the first amplifier has substantially the same distortion characteristics as the each of the plurality of amplifiers connected in parallel.

14. A distortion compensation circuit for a power amplifier having a prescribed distortion characteristic comprising;

means for receiving one or more input signals in a predetermined frequency range;

a first circuit path having an input connected to the receiving means and an output including a first amplifier with a predetermined gain and substantially the same prescribed distortion characteristic as the power amplifier responsive to the one or more input signals for generating an output signal including a component corresponding to the one or more input signals modified by said predetermined gain and a distortion component corresponding to the prescribed distortion characteristic;

a second circuit path having an input connected to the receiving means and an output for transferring the one or more input signals without distortion;

first means for combining the output of the first circuit path with the transferred one or more input signals from the output of the second circuit path to form a signal corresponding to the distortion component of the first circuit path output signal;

second means for combining the distortion component signal from the first combining means with the output signal of the first circuit path to form a signal having a component corresponding to the one or more input signals modified by the predetermined gain and a component corresponding to the distortion characteristic of the first amplifier in inverted phase relationship thereto; and means for controlling the signal formed in the first combining means including means for detecting a frequency in the prescribed frequency range at which said one or more input signals are absent;

means for generating a pilot signal at said detected frequency and for applying said pilot signal to the receiving means;

means connected to the output of the first combining means for monitoring the pilot signal at the output of the first combining means; and means in the second circuit path responsive to the output of said monitoring means for adjusting the magnitude and phase of the signal applied to the second circuit path to minimize the monitored pilot signal.

15. A distortion compensation circuit for a power amplifier having a prescribed distortion characteristic according to claim 14 wherein said means for detecting the frequency in the prescribed frequency range at which said one or more input signals are absent comprises means connected to the output of said power amplifier for scanning the prescribed frequency range for a signal at said power amplifier output having a magnitude less than a first predetermined threshold.

16. A distortion compensation circuit for a power amplifier having a prescribed distortion characteristic according to claim 15 wherein said means for monitoring the pilot signal comprises means for generating a signal representative of the magnitude of the pilot signal;

means connected between the means for generating a signal representative of the magnitude of the pilot signal and the means for adjusting the magnitude and the phase of the signal applied to the second circuit path responsive to the signal representative of the magnitude of the pilot signal for producing first and second adjusting signals;

means for applying the first adjusting signal to modify the magnitude of the signal applied to the second circuit path; and means for applying the second adjusting signal to modify the phase of the signal applied to the second circuit path.

17. A distortion compensation circuit for a power amplifier having a prescribed distortion characteristic according to claim 16 wherein the means for producing said first and second adjusting signals comprises means responsive to the magnitude of the monitored pilot signal for sequentially producing one or more first adjusting signals until a fixed number of first adjusting signals is reached or the magnitude of the monitored pilot signal falls below a second threshold; and means responsive to the magnitude of the monitored pilot signal for sequentially producing one or more second adjusting signals until a fixed number of second adjusting signals is reached or the magnitude of the monitored pilot signal falls below the second threshold.

18. A distortion compensation circuit for a power amplifier having a prescribed distortion characteristic according to claim 17 wherein the means for scanning the prescribed range further comprises means responsive to the output of the power amplifier for changing the frequency of the signals from the output of the power amplifier to a predetermined frequency; and
a narrow band receiver for receiving the predetermined frequency.

19. A distortion compensation circuit for a power amplifier having a prescribed distortion characteristic according to claim 14 wherein the power amplifier comprises a plurality of amplifiers connected in parallel each having the prescribed distortion characteristic and the first amplifier has substantially the same distortion characteristic as the each of the plurality of amplifiers connected in parallel.

20. A distortion compensation circuit for a power amplifier having a prescribed distortion characteristic according to claim 14 further comprising means for controlling the signal formed in said second combining means including:
means for detecting an intermodulation product signal in the prescribed frequency range;
means connected to the output of the power amplifier for monitoring the detected intermodulation product signal at the output of the power amplifier; and
means connected between the first and second combining means for adjusting the magnitude and phase of the first combining means output signal to minimize the monitored intermodulation product signal.

21. A distortion compensation circuit for a power amplifier having a prescribed distortion characteristic according to claim 20 wherein means connected between the first and second means for adjusting the magnitude and phase of the first combining means output signal to minimize the monitored intermodulation product signal further comprises means for inverting the phase of the first combining means output signal.

22. A distortion compensation circuit for a power amplifier having a prescribed distortion characteristic according to claim 21 wherein said means for detecting an intermodulation product signal in the prescribed frequency range comprises means connected to the output of said power amplifier for scanning the prescribed frequency range for a signal at said power amplifier output having a magnitude between the first predetermined threshold and a second predetermined threshold below the first threshold.

23. A distortion compensation circuit for a power amplifier having a prescribed distortion characteristic according to claim 22 wherein said means for monitoring said detected intermodulation product signal comprises
means for generating a signal representative of the magnitude of the detected intermodulation product signal;
means connected to the means for generating a signal representative of the magnitude of the intermodulation product signal for producing first and second adjusting signals;
means for applying the first adjusting signal to the means for adjusting the magnitude and phase of the first combining means output signal to modify the magnitude of the first combining means output signal; and
means for applying the second adjusting signal to the means for adjusting the magnitude and phase of the first combining means output signal to modify the phase of the first combining means output signal.

24. A distortion compensation circuit for a power amplifier having a prescribed distortion characteristic according to claim 23 wherein the means for producing said first and second adjusting signals comprises
means responsive to the magnitude of the monitored intermodulation product signal for sequentially producing one or more first adjusting signals until a fixed number of first adjusting signals is reached or the magnitude of the monitored intermodulation product signal falls below the second threshold
means responsive to the magnitude of the monitored intermodulation product signal for sequentially producing one or more second adjusting signals until a fixed number of second adjusting signals is reached or the magnitude of the monitored intermodulation product signal falls below the second threshold.

25. A distortion compensation circuit for a power amplifier having a prescribed distortion characteristic according to claim 24 wherein the means for scanning the prescribed frequency range further comprises means responsive to the output of the power amplifier for changing the frequency of the signals from the output of the power amplifier to a predetermined frequency; and
a narrow band receiver for receiving the predetermined frequency.

* * * * *